(12) United States Patent
Xia

(10) Patent No.: US 11,610,803 B2
(45) Date of Patent: Mar. 21, 2023

(54) MOUNTING FIXTURE OF BEARING RING FOR WAFER

(71) Applicant: CHANGXIN MEMORY TECHNOLOGIES, INC., Hefei (CN)

(72) Inventor: Zhi Xia, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/602,836

(22) PCT Filed: Jul. 12, 2021

(86) PCT No.: PCT/CN2021/105755
§ 371 (c)(1),
(2) Date: Oct. 11, 2021

(87) PCT Pub. No.: WO2022/083181
PCT Pub. Date: Apr. 28, 2022

(65) Prior Publication Data
US 2022/0293449 A1    Sep. 15, 2022

(30) Foreign Application Priority Data

Oct. 20, 2020 (CN) .......................... 202011125860.X

(51) Int. Cl.
*H01L 21/687* (2006.01)
(52) U.S. Cl.
CPC .............................. *H01L 21/68721* (2013.01)
(58) Field of Classification Search
CPC ................. H01L 21/673; H01L 21/687; H01L 21/68721; H01L 21/683; B25B 11/02
See application file for complete search history.

(56) References Cited

U.S. PATENT DOCUMENTS

| 6,100,505 A | 8/2000 | Pike |
| 6,143,082 A | 11/2000 | McInerney et al. |
| 6,293,749 B1* | 9/2001 | Raaijmakers ..... H01L 21/68785 294/902 |

(Continued)

FOREIGN PATENT DOCUMENTS

| CN | 1349656 A | 5/2002 |
| CN | 1879014 A | 12/2006 |
| CN | 202189772 U | 4/2012 |

(Continued)

*Primary Examiner* — Seahee Hong
(74) *Attorney, Agent, or Firm* — Cooper Legal Group, LLC

(57) ABSTRACT

The present disclosure provides a mounting fixture of a bearing ring for a wafer. The bearing ring includes a circular ring portion, screw elements, and multiple permanent seats, wherein the circular ring portion includes a ring body and multiple lugs provided with light holes, each of the permanent seats is provided with a threaded hole, and one of the screw elements can be in threaded connection with the threaded hole after passing through a light hole. The mounting fixture includes a first clamp body and a second clamp body, where the first clamp body is provided with a first circular hole portion and first groove portions; a diameter of the first circular hole portion is greater than or equal to an external diameter of the ring body; the second clamp body is provided with second groove portions penetrating through the second clamp body.

7 Claims, 3 Drawing Sheets

(56) References Cited

U.S. PATENT DOCUMENTS 7,048,488 B1    5/2006   Kuznetsov et al.
7,685,895 B2    3/2010   Sakurai et al.

FOREIGN PATENT DOCUMENTS

| | | |
|---|---|---|
| CN | 202805002 U | 3/2013 |
| CN | 104282603 A | 1/2015 |
| JP | S593935 A | 1/1984 |
| TW | M315405 U | 7/2007 |
| TW | M493744 U | 1/2015 |

\* cited by examiner

MOUNTING FIXTURE OF BEARING RING FOR WAFER

CROSS-REFERENCE TO RELATED APPLICATIONS

The present disclosure is a national stage entry of International Application No. PCT/CN2021/105755, filed on Jul. 12, 2021, which claims the priority to Chinese Patent Application No. 202011125860.X, titled "MOUNTING FIXTURE OF BEARING RING FOR WAFER", filed on Oct. 20, 2020. The entire contents of International Application No. PCT/CN2021/105755 and Chinese Patent Application No. 202011125860.X are incorporated herein by reference.

TECHNICAL FIELD

The present disclosure relates to, but is not limited to, a mounting fixture of a bearing ring for a wafer.

BACKGROUND

During processing of a semiconductor device, a wafer needs to be placed on a heating base in a wafer reaction chamber for reaction for film growth. There are multiple heating bases, and each heating base is provided with one bearing ring for bearing the wafer. The wafer can be moved from one heating base to another heating base through the bearing rings, such that corresponding processes are conducted on the wafer in the heating bases. In an actual process, a reaction derivative is gradually accumulated on the surface of the bearing ring, but the bearing ring cannot be used normally when there is an excessively large quantity of reaction derivative.

Therefore, during maintenance of the wafer reaction chamber, the bearing ring also needs to be processed. Specifically, multiple permanent seats and screw elements on the bearing ring are disassembled from a circular ring portion of the bearing ring, the components are cleaned and wiped, and then the permanent seats, the screw elements, and the circular ring portion are reassembled together.

Currently, it takes a relatively long time to assemble the bearing ring, seriously reducing the efficiency of maintaining the bearing ring.

SUMMARY

An overview of the subject matter detailed in the present disclosure is provided below, which is not intended to limit the protection scope of the claims.

The present disclosure provides a mounting fixture of a bearing ring for a wafer. The bearing ring includes a circular ring portion, screw elements, and multiple permanent seats, where the circular ring portion includes a ring body and multiple lugs, and the multiple lugs are evenly distributed on an outer wall of the ring body; threaded holes are arranged at a first end of each of the permanent seats, each of the multiple lugs is provided with a light hole, and one of the screw elements can be in threaded connection with the threaded hole after passing through the light hole; when the permanent seat is connected to the lug, a second end of the permanent seat can face towards a center of the ring body and protrude from an inner wall of the ring body; and second ends of the multiple permanent seats form a bearing surface for bearing a wafer; and the mounting fixture includes:

a first clamp body, provided with a first circular hole portion and first groove portions, a diameter of the first circular hole portion being greater than or equal to an external diameter of the ring body; each of the first groove portions extends from an inner wall of the first circular hole portion to an outer side of the first clamp body; and the first groove portion can clamp the lug when the ring body is located on the first circular hole portion; and a second clamp body, fixedly connected to the first clamp body, the second clamp body being provided with second groove portions, and each of the second groove portions penetrates through the second clamp body; and when the first groove portions clamps the lug, the permanent seat can penetrate into the second groove portion from one side that is of the second groove portion and that is far away from the first groove portion, a central axis of the threaded hole coincides with a central axis of the light hole, and the permanent seat can pass through one side that is of the first groove portion and that is far away from the second groove portion.

In the mounting fixture of the bearing ring for a wafer in this embodiment of the present disclosure, the diameter of the first circular hole portion of the first clamp body is greater than or equal to the external diameter of the ring body, such that the ring body of the circular ring portion can be placed in the first circular hole portion. In addition, the first groove portion extends from the inner wall of the first circular hole portion to the outer side of the first clamp body, and the first groove portion of the first clamp body can clamp the lug of the circular ring portion when the ring body is located on the first circular hole portion, or in other words, the first clamp body can fasten the circular ring portion.

Moreover, the second clamp body is fixedly connected to the first clamp body; the second groove portion of the second clamp body and the first groove portion of the first clamp body are disposed opposite to each other; and when the first groove portion clamps the lug, the permanent seat can penetrate into the second groove portion from the side that is of the second groove portion and that is far away from the first groove portion, the central axis of the threaded hole in the permanent seat coincides with the central axis of the light hole in the lug, and the permanent seat can pass through from the side that is of the first groove portion and that is far away from the second groove portion.

Other aspects of the present disclosure are understandable upon reading and understanding the accompanying drawings and detailed description.

BRIEF DESCRIPTION OF THE DRAWINGS

The accompanying drawings incorporated into the specification and constituting a part of the specification illustrate embodiments of the present disclosure, and are configured to explain the principles of the embodiments of the present disclosure together with the description. In these accompanying drawings, similar reference numerals are configured to represent similar elements. The accompanying drawings in the following description show merely some rather than all of the embodiments of the present disclosure. Persons skilled in the art may derive other accompanying drawings from these accompanying drawings without creative efforts.

DETAILED DESCRIPTION

Figure 1:
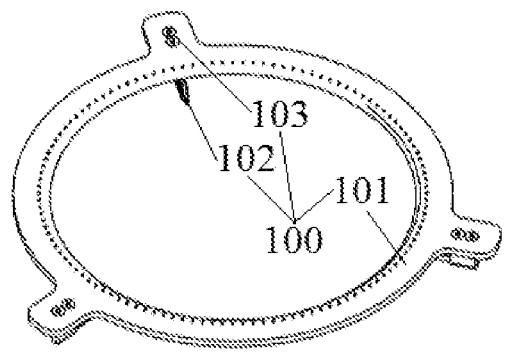
FIG. 1 is a schematic structural diagram of a bearing ring in a related technology.

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by persons skilled in the art based on the embodiments in the present disclosure without creative efforts shall fall within the protection scope of the present disclosure. It should be noted that the embodiments in the present disclosure and features in the embodiments may be combined with each other in a non-conflicting manner.

As shown in FIG. 1 to FIG. 4, a bearing ring 100 is configured to bear a wafer 105. For example, the bearing ring 100 may be a ceramic ring. The bearing ring 100 may alternatively be made of another high-temperature-resistant material. This is not specially limited herein.

The bearing ring 100 may include a circular ring portion 101, multiple permanent seats 102, and screw elements 103.

The circular ring portion 101 may include a ring body 1011 and lugs 1012. There are multiple lugs 1012. For example, a quantity of lugs 1012 may be three, four, five, or the like. The multiple lugs 1012 may be evenly distributed on an outer wall of the ring body 1011. In addition, each of the lugs 1012 is provided with a light hole 10120. A diameter of the light hole 10120 is greater than an external diameter of a screw portion of each of the screw elements 103 and is less than an external diameter of a head portion of the screw element 103, such that the screw element 103 can pass through the light hole 10120.

A threaded hole 1020 is arranged at a first end of each of the permanent seats 102, and a specification of the threaded hole 1020 is the same as that of the screw portion of the screw element 103, such that the screw element 103 can be in threaded connection with the threaded hole 1020 after passing through the light hole 10120, so as to implement assembly of the circular ring portion 101, the permanent seats 102, and the screw elements 103.

The permanent seat 102 may include a connecting block 1021 and a bearing rod 1022, and the connecting block 1021 is provided with the threaded hole 1020, and can be connected to the lug 1012. One end of the bearing rod 1022 is connected to the connecting block 1021, and a roller 1023 is arranged at the other end of the bearing rod 1022. In addition, when the connecting block 1021 is connected to the lug 1012, the end that is of the bearing rod 1022 and at which the roller 1023 is disposed can face towards a center of the ring body 1011 and protrudes from an inner wall of the ring body 1011, so as to form a bearing surface 104, and the bearing surface is configured to bear the wafer 105.

It should be noted that the roller 1023 can guide the wafer 105 placed on the bearing rod 1022, such that the wafer 105 can be properly placed on the bearing surface 104. This is not described in detail herein again.

The screw element 103 may include a screw 1031 and a corrugated gasket 1032. The screw 1031 includes the screw portion and the head portion described above, and details are not repeated again. The corrugated gasket 1032 may be disposed between the head portion of the screw 1031 and a top surface of the lug 1012, and is configured to prevent the screw 1031 from being loosened due to external force and other reasons after the screw 1031 is fastened.

Figure 4:
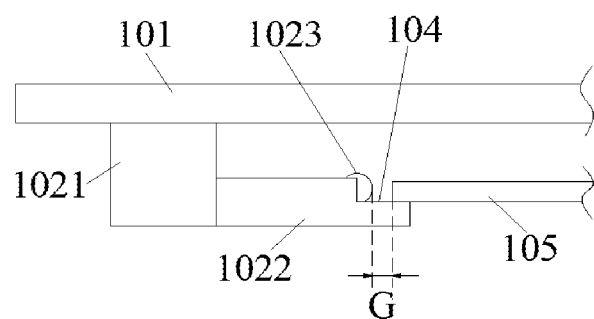
FIG. 4 is a schematic diagram of a gap between a roller and a wafer.

As shown in FIG. 4, in an actual use process, there is a tiny gap G between the roller 1023 and the wafer 105, and a reference range of the gap G is 0.006-0.012 inches.

The gap G of 0.006 inches is configured to ensure that the wafer 105 can be placed on the bearing rod 1022 in good condition, and the gap G of 0.012 inches is configured to ensure that the wafer 105 does not deviate too much when it falls to a heating base, so as to avoid a case in which an eccentric circle is formed during reaction of the wafer 105 for film growth, thereby ensuring a yield of wafers 105.

Currently, an operation process includes fastening one permanent seat 102 and then fastening another permanent seat 102. However, because there are tiny machining errors in the circular ring portion 101, the permanent seats 102, and the screw elements 103, and there is a specific assembly error in a process in which an operator aligns the threaded hole 1020 with the light hole 10120, an error generated after the multiple permanent seats 102 are assembled is amplified. As a result, the gap G between the roller 1023 and the wafer 105 exceeds the reference range.

Therefore, the operator needs to disassemble the permanent seats 102 from the circular ring portion 101 and assemble the permanent seats 102 again until the gap G falls within the reference range. According to statistical data, the permanent seats 102 need to be assembled for three times on average during maintenance of the bearing ring 100, and it takes a relatively long time, reducing the efficiency of maintaining the bearing ring 100. In addition, the screw 1031 is repeatedly disassembled and assembled. This naturally increases a fracture risk of the screw 1031.

Figure 5:
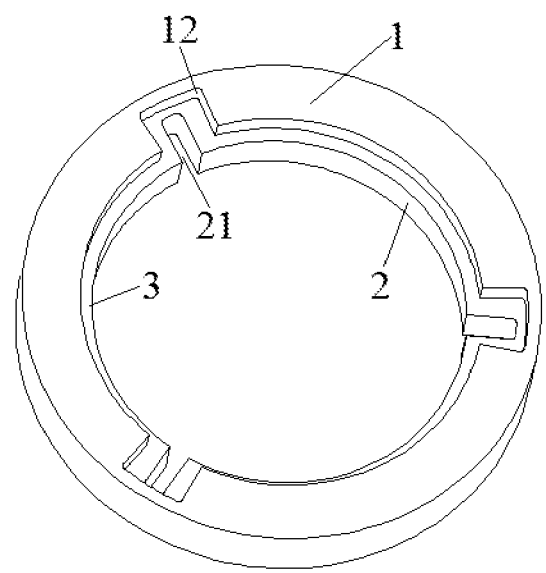
FIG. 5 is a schematic structural diagram of a mounting fixture according to an implementation of the present disclosure.
Figure 6:
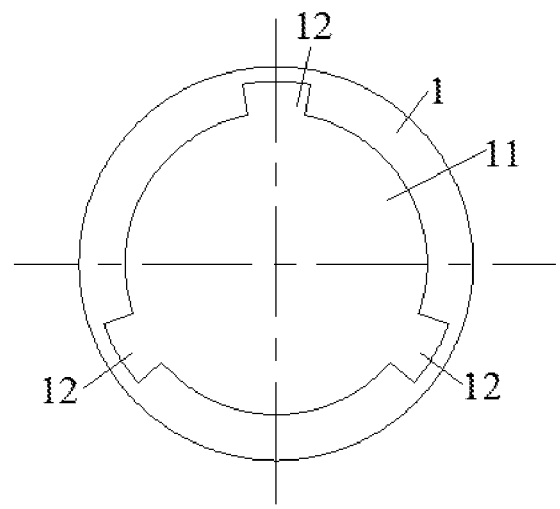
FIG. 6 is a schematic structural diagram of a first clamp body according to an implementation of the present disclosure.
Figure 7:
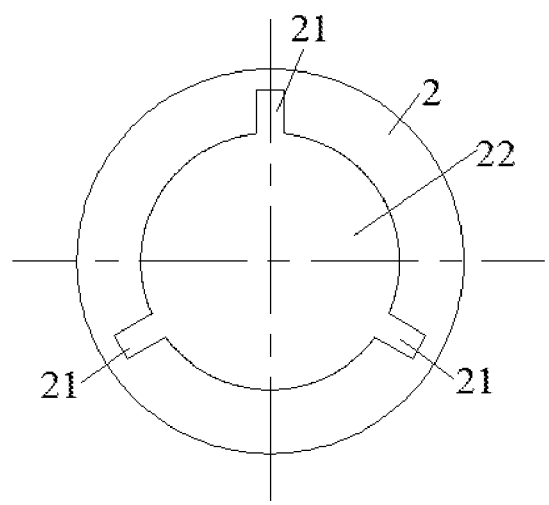
FIG. 7 is a schematic structural diagram of a second clamp body according to an implementation of the present disclosure.

An implementation of the present disclosure provides a mounting fixture of a bearing ring for a wafer. As shown in FIG. 5 to FIG. 7, the mounting fixture may include a first clamp body 1 and a second clamp body 2.

The first clamp body 1 may be provided with a first circular hole portion 11 and first groove portions 12. A diameter of the first circular hole portion 11 may be greater than or equal to an external diameter of the ring body 1011. Each of the first groove portions 12 extends from an inner wall of the first circular hole portion 11 to an outer side of the first clamp body 1. The first groove portion 12 can clamp the lug 1012 when the ring body 1011 is located on the first circular hole portion 11, or in other words, the first clamp body 1 can fasten the circular ring portion 101.

The second clamp body 2 may be fixedly connected to the first clamp body 1, the second clamp body 2 may be provided with second groove portions 21, and each of the second groove portions 21 penetrates through the second clamp body 2. When the first groove portion 12 clamps the lug 1012, the permanent seat 102 can penetrate into the second groove portion 21 from one side that is of the second groove portion 21 and that is far away from the first groove portion 12, a central axis of the threaded hole 1020 coincides with a central axis of the light hole 10120, and the permanent seat 102 can pass through one side that is of the first groove portion 12 and that is far away from the second groove portion 21.

Therefore, the operator only needs to allow the screw elements 103 to pass through the light holes 10120 and be in threaded connection with the threaded holes 1020, to assemble the circular ring portion 101, the screw elements 103, and the permanent seats 102, and then takes out the bearing ring 100 from the mounting fixture to complete an entire assembly process.

Therefore, positions of the permanent seats 102 need to be repeatedly adjusted, in the present disclosure, the second clamp body 2 can position the multiple permanent seats 102 at the same time, to ensure relative positions of second ends of the permanent seats 102, and make a gap G between each roller 1023 and the wafer 105 fall within the reference range.

In other words, by using the mounting fixture in this implementation of the present disclosure, the multiple permanent seats 102 can be successfully assembled at one time, so as to shorten an assembly time of the bearing ring 100, thereby improving the efficiency of maintaining the bearing ring 100.

In addition, the screw 1031 does not need to be repeatedly disassembled and assembled any longer. This naturally reduces abrasion of the screw 1031 made of a ceramic material, prolongs a service life of the screw 1031, and reduces a fracture risk of the screw 1031.

The mounting fixture in the implementation of the present disclosure is described in detail below with reference to the accompanying drawings.

As shown in FIG. 5 and FIG. 6, the first clamp body 1 is configured to fasten the circular ring portion 101, and the first clamp body 1 may be provided with the first circular hole portion 11 and the first groove portions 12.

The diameter of the first circular hole portion 11 is greater than or equal to the external diameter of the ring body 1011, such that the ring body 1011 may be placed in the first circular hole portion 11. This is not specially limited herein. In some exemplary implementations, the diameter of the first circular hole portion 11 may be equal to the external diameter of the ring body 1011. In this case, not only the assembly smoothness can be ensured, but also an assembly error can be reduced.

The first circular hole portion 11 may penetrate through the first clamp body 1, or in other words, the first circular hole portion 11 may be a through hole. For example, the first circular hole portion 11 may alternatively be a blind hole. Correspondingly, a height of the first circular hole portion 11 is less than that of the first clamp body 1. This is not specially limited herein.

The first groove portion 12 extends from the inner wall of the first circular hole portion 11 to the outer side of the first clamp body 1, or in other words, the first groove portion 12 is communicated with the first circular hole portion 11. Therefore, when the ring body 1011 is located on the first circular hole portion 11, the lug 1012 can be placed in the first groove portion 12, and the first groove portion 12 can clamp the lug 1012, thereby fastening the circular ring portion 101 to the first clamp body 1.

In some exemplary implementations, left and right inner walls of the first groove portion 12 may be arranged at an acute angle, such that the inner walls of the first groove portion 12 can abut against the lug 1012.

In some exemplary implementations, when the ring body 1011 is located on the first circular hole portion 11, the inner walls of the first groove portion 12 completely fit to an outer wall of the lug 1012. In other words, shapes and sizes of the first groove portion 12 and the lug 1012 are completely the same. Therefore, not only the assembly smoothness can be ensured, but also the assembly error can be reduced.

In some exemplary implementations, an outer edge of the first clamp body 1 may be in a shape of a circle, a square, a triangular, or the like. These shapes are not listed herein one by one. In addition, a thickness of the first clamp body 1 may be greater than or equal to that of the ring body 1011. For example, the thickness of the first clamp body 1 is equal to the thickness of the ring body 1011. In this case, the first circular hole portion 11 is a through hole, so as to ensure the assembly smoothness.

As shown in FIG. 5 and FIG. 7, the second clamp body 2 is fixedly connected to the first clamp body 1, and the connection manner between the second clamp body 2 and the first clamp body 1 may be welding, clamping or the like. These connection manners are not listed herein one by one. In some exemplary implementations, the first clamp body 1 and the second clamp body 2 may alternatively be integrally formed. In this way, not only the position accuracy of the first clamp body 1 and the second clamp body 2 can be ensured, but also a processing difficulty of the mounting fixture can be reduced.

Figure 2:
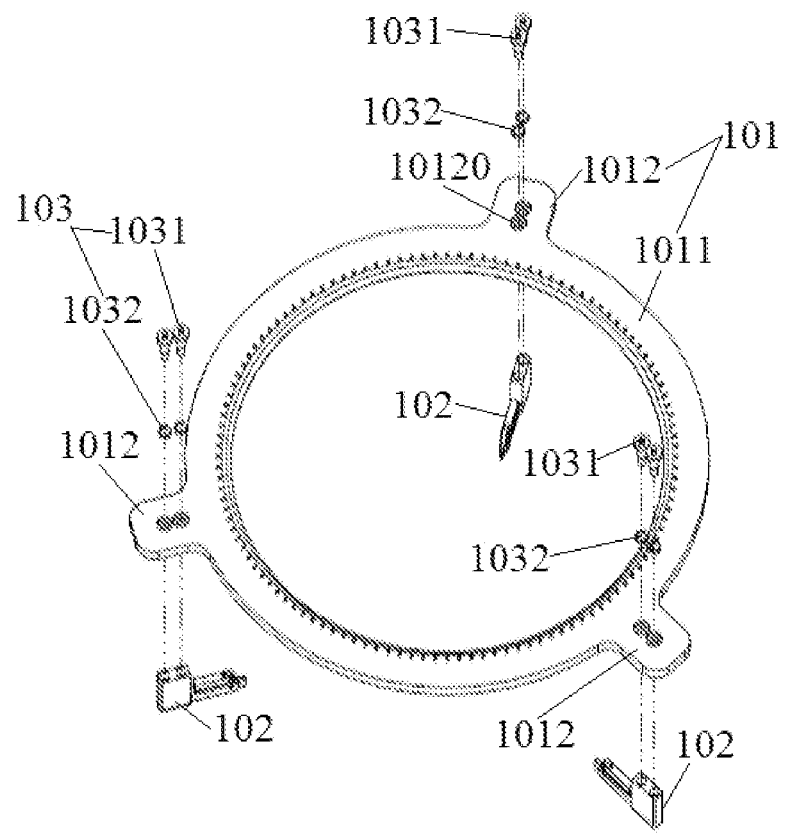
FIG. 2 is an exploded schematic diagram of various parts of a bearing ring in a related technology.

The second clamp body 2 is configured to position the permanent seat 102. For example, the second clamp body 2 may be provided with the second groove portions 21, and each of the second groove portions 21 may penetrate through the second clamp body 2. As shown in FIG. 1 and FIG. 2, a width of the permanent seat 102 is less than a width of the lug 1012. Correspondingly, a width of the first groove portion 12 is greater than a width of the second groove portion 21. This is not described in detail herein again.

Therefore, when the first groove portion 12 clamps the lug 1012, the permanent seat 102 can penetrate into the second groove portion 21 from the side that is of the second groove portion 21 and that is far away from the first groove portion 12, and the central axis of the threaded hole 1020 of the permanent seat 102 coincides with the central axis of the light hole 10120 of the lug 1012.

Correspondingly, the operator inserts screws 1031 through the light holes 10120 and then screw the screws 1031 into the threaded holes 1020, such that the circular ring portion 101, the screw elements 103, and the permanent seats 102 can be assembled together, and the gap G between each roller 1023 and the wafer 105 can fall within the reference range at one time.

In some example embodiments, when the permanent seat 102 penetrates into the second groove portion 21, an inner wall of the second groove portion 21 completely fits to an outer wall of the permanent seat 102. Therefore, it can be ensured that the central axis of the threaded hole 1020 coincides with the central axis of the light hole 10120. Moreover, it is ensured that the permanent seat 102 can be pulled out from the side that is of the first groove portion 12 and that is far away from the second groove portion 21, so as to complete the entire operation process.

Therefore, the mounting fixture in this implementation of the present disclosure not only can shorten the assembly time of the bearing ring 100, thereby improving the efficiency of maintaining the bearing ring 100. In addition, the screw 1031 does not need to be repeatedly disassembled and assembled any longer. This naturally reduces abrasion of the screw 1031 made of a ceramic material, prolongs a service life of the screw 1031, and reduces a fracture risk of the screw 1031.

As shown in FIG. 7, the second clamp body 2 may be further provided with a second circular hole portion 22, and a central axis of the second circular hole portion 22 coincides with a central axis of the first circular hole portion 11, or in other words, the second circular hole portion 22 and the first circular hole portion 11 are disposed opposite to each other; and the second groove portion 21 extends from an inner wall of the second circular hole portion 22 to an outer side of the second clamp body 2, or in other words, the second groove portion 21 is communicated with the second circular hole portion 22. This is not described in detail herein again.

As described above, the permanent seat 102 includes the connecting block 1021 and the bearing rod 1022; and when the permanent seat 102 is connected to the lug 1012, projection of the connecting block 1021 on the lug 1012 is in the lug 1012, and the end that is of the bearing rod 1022 and at which the roller 1023 is disposed protrudes from the inner wall of the ring body 1011. Correspondingly, the inner wall of the second groove portion 21 completely fits to an outer wall of the connecting block 1021, so as to ensure that the central axis of the threaded hole 1020 coincides with the central axis of the light hole 10120. This is not described in detail herein again.

Therefore, the connecting block 1021 may penetrate through the second groove portion 21 and the first groove portion 12 successively, and at the same time, the bearing rod 1022 may also penetrate through the second circular hole portion 22 and the first circular hole portion 11 successively. In this way, after the circular ring portion 101, the screw elements 103, and the permanent seats 102 are assembled, the operator may directly pull out the bearing ring 100 from the mounting fixture, so as to complete the entire operation process.

In addition, a diameter of the second circular hole portion 22 may be equal to or less than a diameter of the first circular hole portion 11. Descriptions are provided below based on the following cases.

Figure 3:
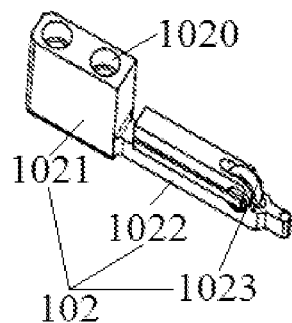
FIG. 3 is a schematic structural diagram of a permanent seat in a related technology.

(1) When the diameter of the second circular hole portion 22 is equal to the diameter of the first circular hole portion 11, the second circular hole portion 22 and the first circular hole portion 11 form a light hole. As shown in FIG. 2 and FIG. 3, the lug 1012 protrudes from the connecting block 1021, and correspondingly a depth of the first groove portion 12 is greater than a depth of the second groove portion 21, so as to ensure a connection between the connecting block 1021 and the lug 1012. This is not described in detail herein again.

In some exemplary implementations, the inner wall of the second circular hole portion 22 is provided with multiple bosses for supporting the ring body 1011. For example, the multiple bosses may be evenly distributed, and the multiple bosses are arranged far away from the second groove portion 21. This is not described in detail herein again.

The depth of the second groove portion 21 determines the gap G between each roller 1023 and the wafer 105. Therefore, during processing of the mounting fixture, the gap G may be ensured by determining a depth value of the second groove portion 21.

As described above, the reference range of the gap G is 0.006-0.012 inches. Therefore, a specific value of the gap G may be set to 0.009 inches, and the depth of the second groove portion 21 is calculated with reference to sizes of various components of the mounting fixture, so as to ensure that the multiple permanent seats 102 can be successfully assembled at one time.

In some exemplary implementations, the specific value of the gap G may alternatively be set to 0.007 inches, 0.008 inches, 0.010 inches, 0.011 inches, or the like. This is not specially limited herein.

(2) When the diameter of the second circular hole portion 22 is less than the diameter of the first circular hole portion 11, the diameter of the second circular hole portion 22 should be greater than an internal diameter of the ring body 1011, such that the wafer 105 can be placed on the bearing surface 104 formed by the multiple bearing rods 1022.

As shown in FIG. 5, the second circular hole portion 22 and the first circular hole portion 11 may form an annular step 3, and the annular step 3 can support the ring body 1011, thereby facilitating transfer of the wafer 105 through the bearing ring 100.

The following further completely describes a use process of the mounting fixture in this implementation of the present disclosure.

First, the connecting block 1021 of each permanent seat 102 is clamped in the corresponding second groove portion 21 of the second clamp body 2.

Second, the ring body 1011 of the circular ring portion 101 is placed in the first circular hole portion 11 of the first clamp body 1, and in this case, the lugs 1012 of the circular ring portion 101 and the first groove portions 12 of the first clamp body 1 are clamped, and central axes of the threaded holes 1020 of the permanent seats 102 coincide with central axes of the light holes 10120 of the lugs 1012.

Then, the screw elements 103 are allowed to pass through the light holes 10120 of the lugs 1012, and are in threaded connection with the threaded holes 1020 of the permanent seats 102, so as to implement assembly of the circular ring portion 101, the screw elements 103, and the permanent seats 102.

Finally, the bearing ring 100 is pulled out from the mounting fixture, so as to complete the entire operation process of the bearing ring 100.

Each embodiment or implementation in the specification is described in a progressive manner. Each embodiment focuses on the difference from other embodiments, and for the same and similar parts between the embodiments, mutual reference may be made.

In the descriptions of this specification, a description with reference to the term "embodiment", "exemplary embodiment", "some implementations", "an exemplary implementation", "an example", and the like means that a specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be understood that, in the descriptions of the present disclosure, orientations or position relationships indicated by terms such as "center", "upper", "lower", "left", "right", "vertical", "horizontal", "inside", and "outside" are orientations or position relationships based on illustrations in the accompanying drawings. The terms are merely intended to facilitate and simplify the descriptions of this application, but are not intended to indicate or imply that an indicated apparatus or element needs to have a particular orientation and needs to be constructed and operated in a particular orientation, and therefore cannot be construed as a limitation on the present disclosure.

It can be understood that the terms "first", "second", and the like used in the present disclosure can be configured to describe various structures in the present disclosure, but these structures are not limited by these terms. These terms are only configured to distinguish a first structure from another structure.

In one or more drawings, same components are represented by similar reference numerals. For clarity, various parts in the accompanying drawings are not drawn to scale. In addition, some well-known parts may not be shown. For brevity, a structure obtained after several steps are implemented may be described in one figure. In the following, many specific details in the present disclosure are described, for example, a structure, a material, and a dimension of a device, and a processing process and a technology for the device, to understand the present disclosure more clearly. However, as persons skilled in the art can understand, the present disclosure may not be implemented according to these specific details.

Finally, it should be noted that the above embodiments are merely intended to describe the technical solutions of the present disclosure, rather than to limit the present disclosure. Although the present disclosure is described in detail with reference to the above embodiments, persons skilled in the art should understand that they may still make modifications to the technical solutions described in the above embodiments or make equivalent replacements to some or all technical features thereof, without departing from the scope of the technical solutions in the embodiments of the present disclosure.

INDUSTRIAL APPLICABILITY

In the mounting fixture of the bearing ring for a wafer in this embodiment of the present disclosure, the diameter of the first circular hole portion of the first clamp body is greater than or equal to the external diameter of the ring body, such that the ring body of the circular ring portion can be placed in the first circular hole portion. In addition, the first groove portion extends from the inner wall of the first circular hole portion to the outer side of the first clamp body, and the first groove portion of the first clamp body can clamp the lug of the circular ring portion when the ring body is located on the first circular hole portion, or in other words, the first clamp body can fasten the circular ring portion. Moreover, the second clamp body is fixedly connected to the first clamp body; the second groove portion of the second clamp body and the first groove portion of the first clamp body are disposed opposite to each other; and when the first groove portion clamps the lug, the permanent seat can penetrate into the second groove portion from the side that is of the second groove portion and that is far away from the first groove portion, the central axis of the threaded hole in the permanent seat coincides with the central axis of the light hole in the lug, and the permanent seat can pass through from the side that is of the first groove portion and that is far away from the second groove portion. Therefore, an operator only needs to allow the screw elements to pass through the light holes in the lugs and be in threaded connection with the threaded holes of the permanent seats, to assemble the circular ring portion, the screw elements, and the permanent seats together, and then takes out the bearing ring from the mounting fixture to complete the entire operation process. Therefore positions of the permanent seats need to be repeatedly adjusted, in the present disclosure, the second clamp body can position the multiple permanent seats at the same time, to ensure relative positions of the second ends of the permanent seats. In this way, not only it takes a relatively short time to assemble the bearing ring, but also the efficiency of maintaining the bearing ring is improved.

The invention claimed is:

1. A combination of a mounting fixture and a bearing ring for a wafer,
the bearing ring comprising a circular ring portion, screw elements, and multiple permanent seats, the circular ring portion comprising a ring body and multiple lugs, and the multiple lugs are evenly distributed on an outer wall of the ring body; threaded holes are arranged at a first end of each of the multiple permanent seats, each of the multiple lugs is provided with a light hole, and one of the screw elements is configured to be in threaded connection with a corresponding one of the threaded holes after passing through the light hole; when each of the multiple permanent seats is connected to a corresponding one of the multiple lugs, a second end of each of the multiple permanent seats is configured to face towards a center of the ring body and protrude from an inner wall of the ring body; and the second ends of the multiple permanent seats form a bearing surface for bearing the wafer; and
the mounting fixture comprising:
a first clamp body, provided with a first circular hole portion and first groove portions, a diameter of the first circular hole portion being greater than or equal to an external diameter of the ring body; each of the first groove portions extends from an inner wall of the first circular hole portion to an outer side of the first clamp body; and each of the first groove portions is configured to clamp to a corresponding one of the lugs when the ring body is located on the first circular hole portion; and
a second clamp body, fixedly connected to the first clamp body, the second clamp body being provided with second groove portions, and each of the second groove portions penetrates through the second clamp body; and when the first groove portions clamp to the corresponding one of the lugs, a corresponding one of the multiple permanent seats is configured to penetrate into a corresponding one of the second groove portions from one side that is of a corresponding one of the second groove portions and that is far away from a corresponding one of the first groove portions, a central axis of the corresponding one of the threaded holes coincides with a central axis of the light hole, and each of the multiple permanent seats is configured to pass through one side that is of the corresponding one of the first groove portions and that is far away from the corresponding one of the second groove portions;
wherein the second clamp body is further provided with a second circular hole portion, and a central axis of the second circular hole portion coincides with a central axis of the first circular hole portion, wherein each of the second groove portions extends from an inner wall of the second circular hole portion to an outer side of the second clamp body; a width of each of the second groove portions is less than a width of each of the first groove portions; and
wherein a diameter of the second circular hole portion is equal to the diameter of the first circular hole portion.

2. The combination of the mounting fixture and the bearing ring according to claim 1, wherein when the ring body is located on the first circular hole portion, an inner wall of each of the first groove portions completely fits to an outer wall of the corresponding one of the lugs, such that each of the first groove portions is configured to clamp to the corresponding one of the lugs.

3. The combination of the mounting fixture and the bearing ring according to claim 1, wherein the first circular hole portion passes through the first clamp body.

4. The combination of the mounting fixture and the bearing ring according to claim 2, wherein a thickness of the first clamp body is greater than or equal to a thickness of the ring body.

5. The combination of the mounting fixture and the bearing ring according to claim 1, wherein when each of the multiple permanent seats penetrates into the corresponding one of the second groove portions from the side that is of the corresponding one of the second groove portions and that is far away from the corresponding one of the first groove portions, an inner wall of each of the second groove portions completely fits to an outer wall of the corresponding one of the multiple permanent seats, and the central axis of the corresponding one of the threaded holes coincides with the central axis of the light hole.

6. The combination of the mounting fixture and the bearing ring according to claim 1, wherein a depth of each of the first groove portions is greater than a depth of each of the second groove portions.

7. The combination of the mounting fixture and the bearing ring according to claim 1, wherein the first clamp body and the second clamp body are integrally formed.

* * * * *